(12) United States Patent
Sekine et al.

(10) Patent No.: US 10,790,085 B2
(45) Date of Patent: Sep. 29, 2020

(54) IGNITION DEVICE

(71) Applicants: SANKEN ELECTRIC CO., LTD., Niiza-Shi, Saitama (JP); DENSO CORPORATION, Kariya, Aichi-pref (JP)

(72) Inventors: Nobuaki Sekine, Kawagoe (JP); Shunichi Takeda, Kariya (JP)

(73) Assignees: SANKEN ELECTRIC CO., LTD., Niiza-shi (JP); DENSO CORPORATION, Kariya (JP)

( * ) Notice: Subject to any disclaimer, the term of this patent is extended or adjusted under 35 U.S.C. 154(b) by 394 days.

(21) Appl. No.: 15/920,539

(22) Filed: Mar. 14, 2018

(65) Prior Publication Data

US 2018/0277302 A1 Sep. 27, 2018

(30) Foreign Application Priority Data

Mar. 27, 2017 (JP) .................. 2017-061169

(51) Int. Cl.
| | |
|---|---|
| *H03K 3/017* | (2006.01) |
| *H01F 38/12* | (2006.01) |
| *H02J 7/00* | (2006.01) |
| *F02P 3/05* | (2006.01) |
| *H01T 15/00* | (2006.01) |
| *H02M 1/36* | (2007.01) |
| *H02M 3/335* | (2006.01) |
| *H02J 7/14* | (2006.01) |

(Continued)

(52) U.S. Cl.
CPC ............. *H01F 38/12* (2013.01); *F02P 3/01* (2013.01); *F02P 3/05* (2013.01); *H01T 15/00* (2013.01); *H02J 7/0063* (2013.01); *H02J 7/1446* (2013.01); *H02M 1/36* (2013.01); *H02M 3/335* (2013.01); *H03K 3/017* (2013.01); *F02P 9/007* (2013.01)

(58) Field of Classification Search
USPC .................................. 361/247, 253
See application file for complete search history.

(56) References Cited

U.S. PATENT DOCUMENTS

| | | | | |
|---|---|---|---|---|
| 4,641,626 | A * | 2/1987 | Morino | F02P 9/002 |
| | | | | 123/620 |
| 2016/0201637 | A1* | 7/2016 | Sekine | F02P 3/0435 |
| | | | | 315/209 T |

FOREIGN PATENT DOCUMENTS

| | | |
|---|---|---|
| JP | 2001-217131 A | 8/2001 |
| JP | 2016-125466 A | 7/2016 |

* cited by examiner

*Primary Examiner* — Danny Nguyen
(74) *Attorney, Agent, or Firm* — Metrolex IP Law Group, PLLC (57) ABSTRACT

An ignition coil includes a first winding, a second winding, and a third winding. A first switch is electrically connected to the first winding. A battery is electrically connected to the first winding. A booster is electrically connected to the battery. A second switch is electrically connected to the third winding. A drive device drives the first switch and the second switch. The drive device turns the first switch from on-state to off-state to allow a secondary current to flow through the second winding, turns the second switch from off-state to on-state to supply an output of the booster to the third winding, and superimpose a second current to the second winding. When a third winding current becomes equal to or greater than a predetermined value, the booster controls such that power generated by the third winding current and an output voltage of the booster is restricted to constant power.

3 Claims, 10 Drawing Sheets

(51) Int. Cl.
*F02P 3/01* (2006.01)
*F02P 9/00* (2006.01)

IGNITION DEVICE

CROSS REFERENCE TO RELATED APPLICATIONS

This application claims priority based on 35 USC 119 from prior Japanese Patent Applications No. 2017-061169 filed on Mar. 27, 2017, entitled "IGNITION DEVICE", the entire contents of which are incorporated herein by reference.

BACKGROUND

The disclosure relates to an ignition device including an ignition coil for an internal-combustion engine.

Figure 10:
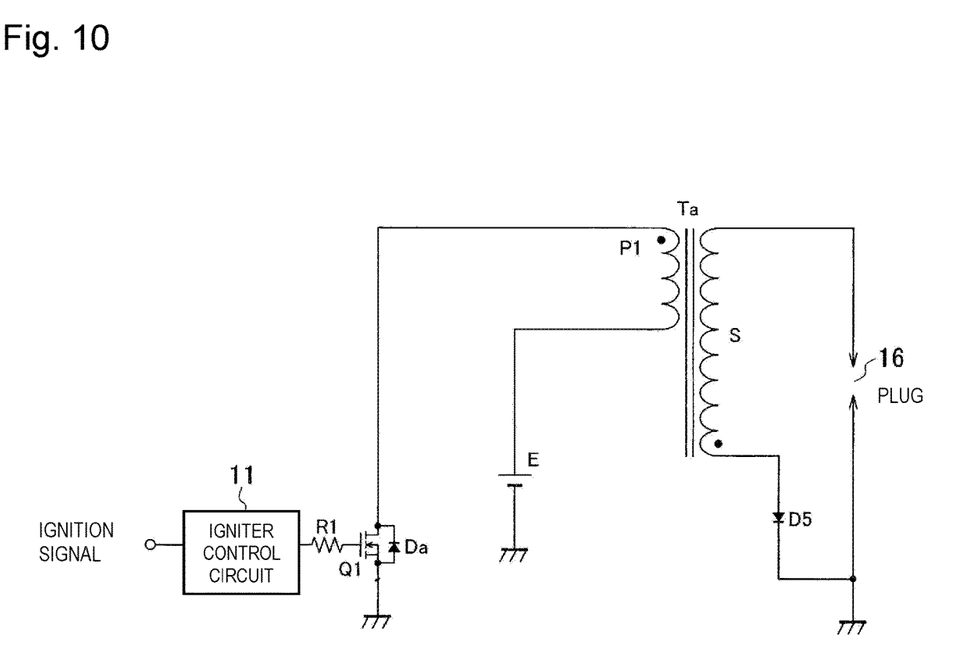
FIG. 10 is a diagram illustrating a circuit configuration of a conventional ignition device.

Japanese Patent Application Publication Nos. 2001-217131 (PL1) and 2016-125466 (PL2) disclose Ignition devices. As illustrated in FIG. 10, the ignition device including the ignition coil disclosed in PL1 includes an igniter control circuit 11, an igniter switch Q1, a transformer Ta, a battery E, and a diode D5 while employing a flyback control method.

The igniter control circuit 11 receives an ignition signal and turns the igniter switch Q1 on or off according to the ignition signal. During a period when the igniter switch Q1 is on, energy is stored into the transformer Ta, and during a period when the igniter switch Q1 is off, the energy stored in the transformer Ta is supplied to a plug 16 to ignite the plug 16.

However, since the conventional transformer Ta generates a high voltage on a secondary side, a turns ratio between a primary side and the secondary side of the transformer is large. This causes large consumption of the energy stored in the transformer during voltage conversion. A period when a current can be supplied to the plug 16 is thus short, thereby limiting a firing period of the plug 16. As a result, combustion efficiency of fuel is reduced, which arouses concerns such as deterioration of exhaust gas due to the poor combustion of a part of the fuel.

In addition, excessive power consumption by the plug causes the plug to be worn out easily.

SUMMARY

An ignition device according to one or more embodiments include: an ignition coil including a first winding, a second winding, and a third winding that are electromagnetically coupled to each other; a first switch electrically connected to a first end of the first winding; a battery electrically connected to a second end of the first winding; a booster including a first end electrically connected to the battery and a second end electrically connected to a first end of the third winding; a second switch electrically connected to a second end of the third winding; and a drive device that drives the first switch and the second switch to turn on and off. The drive device according to one or more embodiments may turn the first switch from on-state to off-state to allow a secondary current to flow through the second winding, turn the second switch from off-state to on-state to supply an output of the booster to the third winding, and superimpose a second current to the second winding. In one or more embodiments, when a third winding current, which flows through the third winding of the ignition coil, becomes equal to or greater than a predetermined value, the booster may control such that power generated by the third winding current and an output voltage of the booster is restricted to constant power.

DETAILED DESCRIPTION

Embodiments are described with reference to drawings, in which the same constituents are designated by the same reference numerals and duplicate explanation concerning the same constituents may be omitted for brevity and ease of explanation. The drawings are illustrative and exemplary in nature and provided to facilitate understanding of the illustrated embodiments and may not be exhaustive or limiting. Dimensions or proportions in the drawings may not be to scale, and are not intended to impose restrictions on the disclosed embodiments. For this reason, specific dimensions and the like should be interpreted with the accompanying descriptions taken into consideration. In addition, the drawings may include parts whose dimensional relationship and ratios are different from one drawing to another.

Prepositions, such as "on", "over" and "above" may be defined with respect to a surface, for example a layer surface, regardless of the orientation of the surface in space.

Embodiment 1

Figure 1:
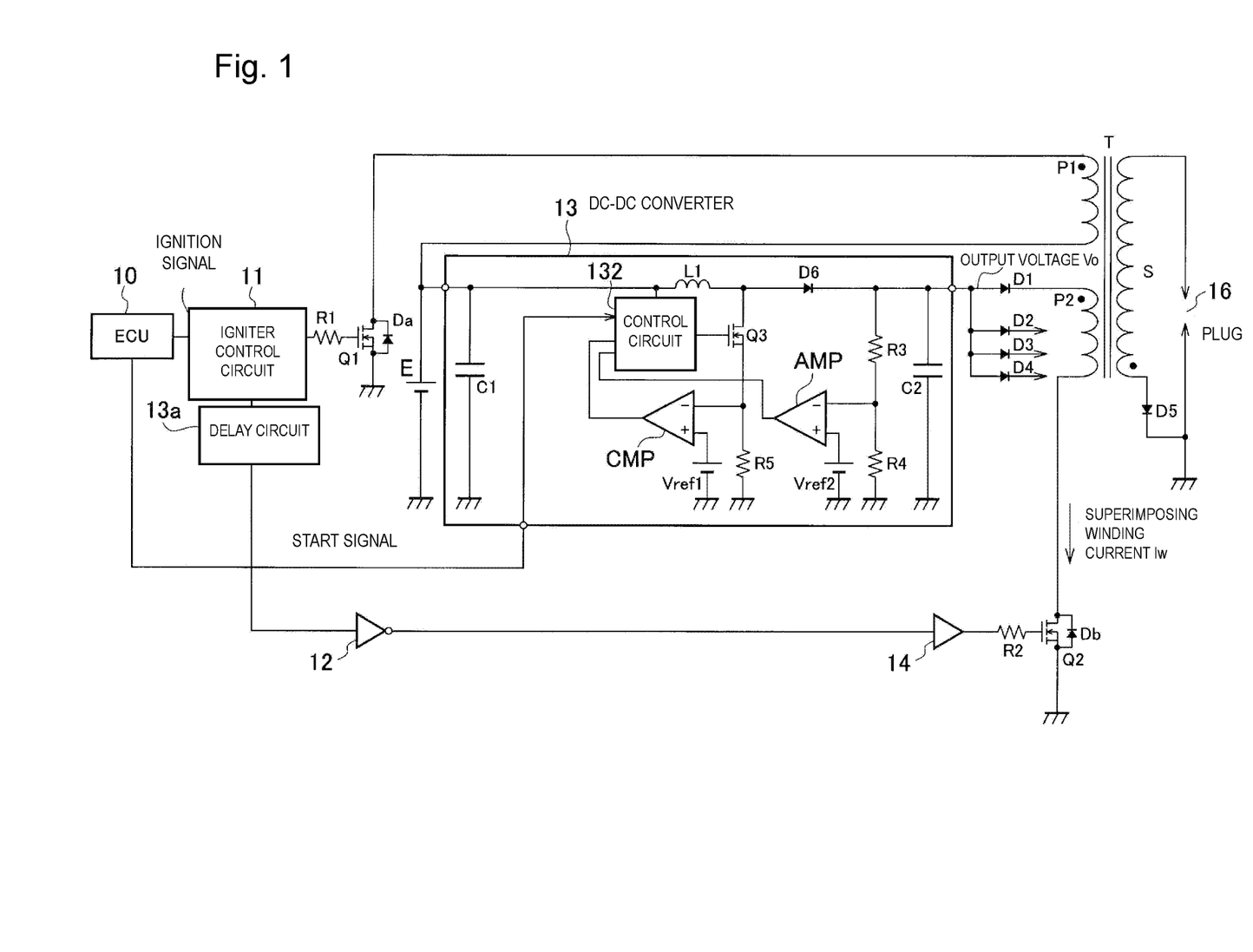
FIG. 1 is a diagram illustrating a circuit configuration of an ignition device according to one or more embodiments.

FIG. 1 is a diagram illustrating a circuit configuration of one or more ignition devices according to an embodiment 1. The ignition device of an embodiment 1 includes an igniter control circuit 11, an igniter switch Q1, a transformer T, a battery E, diodes D1 to D6, Da, and Db, an inverter 12, a DC-DC converter 13, a delay circuit 13a, a buffer circuit 14, and a MOSFET Q2.

An engine control unit (ECU) 10 outputs an ignition signal to the igniter control circuit 11. The igniter control circuit 11 receives the ignition signal from the ECU 10 and turns the igniter switch Q1 on or off according to the ignition signal via a resistor R1. The igniter switch Q1 corresponds to a first switch and includes an N-type Metal-Oxide-Semiconductor Field-Effect Transistor (N-MOSFET), an Insulated Gate Bipolar Transistor (IGBT), or a bipolar transistor.

The transformer T includes an igniter winding P1, a secondary winding S in a reverse phase of the igniter winding P1, and an energy superimposing winding P2, while these three windings are electromagnetically coupled to each other. The transformer T may be an example of "ignition coil" in one or more recited embodiment. The igniter winding P1 may be an example of "first winding" in one or more recited embodiment. The secondary winding S in a reverse phase of the igniter winding P1 may be an example of "second winding" in one or more recited embodiment. The energy superimposing winding P2 may be an example of "third winding" in one or more embodiment.

One end of the igniter winding P1 is connected to a drain of the igniter switch Q1, the other end of the igniter winding P1 is connected to a positive side of the battery E, and a negative side of the battery E is grounded. The diode Da is connected between the drain and a source of the igniter switch Q1. The diode Da may be a parasitic diode of the igniter switch Q1.

The delay circuit 13a delays the ignition signal from the igniter control circuit 11 for a predetermined period of time and then outputs the ignition signal to the inverter 12. The inverter 12 inverts the ignition signal inputted from the delay circuit 13a and then outputs the inverted ignition signal to the buffer circuit 14. Using an accessory switch (ignition-on), the ECU 10 outputs a start signal to a control circuit 132 in the DC-DC converter 13.

The DC-DC converter 13 corresponds to a booster, is started according to the start signal from the ECU 10 (operates continuously), boosts up a voltage of the battery E, and supplies the boosted voltage to anodes of the four diodes D1 to D4 in parallel connection.

The four diodes D1 to D4 are provided respectively for four cylinders of an internal-combustion engine. According to the ignition signal, the switches Q1 and Q2, pairs of which are provided for the respective cylinders, sequentially operate to sequentially ignite the cylinders in turn, thereby superimposing the energy for ignition.

In FIG. 1, one end of the energy superimposing winding P2 is connected to a cathode of the diode D1, the other end of the energy superimposing winding P2 is connected to a drain of the MOSFET Q2, and a source of the MOSFET Q2 is grounded. The diode Db is connected between the drain and the source of the MOSFET Q2. The diode Db may be a parasitic diode of the MOSFET Q2.

Although it is not illustrated, as for each of cathodes of the diodes D2 to D4, one end of a winding corresponding to the energy superimposing winding P2 is connected to the cathode, the other end of that winding is connected to a drain of a MOSFET corresponding to the MOSFET Q2, and a source of that MOSFET is grounded, likewise.

The MOSFET Q2 includes an N-MOSFET and is turned on/off in response to the input of the inverted ignition signal from the inverter 12 to a gate via the buffer circuit 14. The MOSFET Q2 may be an example of "second switch" in one or more embodiments.

While the MOSFET Q2 is in on-state, the DC-DC converter 13 operates so as to continuously supply electric energy to the energy superimposing winding P2 in response to a later-described internal signal. In addition, the DC-DC converter 13 starts to supply the electric energy after a predetermined period of time from when the MOSFET Q2 is switched from off-state to on-state.

Moreover, when a superimposing winding current flowing through the energy superimposing winding P2 becomes equal to or greater than a predetermined value Ib, the DC-DC converter 13 performs control such that the power generated by the superimposing winding current and an output voltage of the DC-DC converter 13 is restricted to constant power.

The igniter control circuit 11 and the inverter 12 correspond to a drive device, and the drive device turns the igniter switch Q1 from on-state to off-state to allow the secondary current to flow to the secondary winding S while switching the MOSFET Q2 from off-state to on-state to supply the output from the DC-DC converter 13 to the energy superimposing winding P2. This extends the supply period of the secondary current.

One end of the secondary winding S of the transformer T is connected to one end of the plug 16 while the other end of the secondary winding S is connected to an anode of the diode D5. A cathode of the diode D5 is connected to the ground.

Next, the configuration of the DC-DC converter 13 is described in details. The DC-DC converter 13 includes a capacitor C1, the control circuit 132, resistors R3 to R5, a capacitor C2, an error amplifier AMP, a comparator CMP, a reactor L1, the diode D6, and a MOSFET Q3.

One end of the capacitor C1, one end of the reactor L1, and one end of the control circuit 132 are connected to the positive side of the battery E while the other end of the capacitor C1 is connected to the ground.

The other end of the reactor L1 is connected to an anode of the diode D6 and a drain of the MOSFET Q3. A cathode of the diode D6 is connected to one end of the resistor R3, one end of the capacitor C2, and the anodes of the diodes D1 to D4.

The other end of the resistor R3 is connected to one end of the resistor R4 and an inverting terminal (−) of the error amplifier AMP while the other end of the resistor R4 is connected to the ground. A non-inverting terminal (+) of the error amplifier AMP is connected to a reference voltage Vref2. An output terminal of the error amplifier AMP is connected to the control circuit 132.

A gate of the MOSFET Q3 is connected to the control circuit 132 while a source of the MOSFET Q3 is connected to one end of the resistor R5 and an inverting terminal (−) of the comparator CMP. A non-inverting terminal (+) of the comparator CMP is connected to a reference voltage Vref1. An output terminal of the comparator CMP is connected to the control circuit 132.

Based on the output from the error amplifier AMP and the output from the comparator CMP, the control circuit 132 outputs a pulse-width modulated (PWM) signal to the gate of the MOSFET Q3 to turn on and off the MOSFET Q3.

Next, an operation of the ignition device of an embodiment 1 that is constructed as the above is described in details. Firstly, an operation for supplying power from the DC-DC converter 13 to the energy superimposing winding P2 is described.

First, the DC-DC converter 13 is started according to the start signal inputted from the ECU 10 (continuous operation). Next, once the igniter switch Q1 is turned on according to the ignition signal, a current flows from the battery E to the ground via the igniter winding P1 and the igniter switch Q1, and the energy is stored into the igniter winding P1. Once the igniter switch Q1 is turned off, a secondary current flows from the secondary winding S via the diode D5, and the energy is supplied to the plug 16.

Next, the igniter switch Q1 is turned off according to an ignition signal at an L level inputted from the igniter control circuit 11. The ignition signal at the L level is delayed for a predetermined period of time by the delay circuit 13a and is inverted by the inverter 12, and an ignition signal at an H level is supplied to the gate of the MOSFET Q2 via the buffer circuit 14, whereby the MOSFET Q2 is turned on. The DC-DC converter 13 boosts up the voltage of the battery E, and supplies the boosted voltage to the anodes of the four diodes D1 to D4. As a result, a current flows from the DC-DC converter 13 to the MOSFET Q2 via the diode D1 and the energy superimposing winding P2.

At that time, the secondary current flows from the secondary winding S via the diode D5, and the energy is supplied to the plug 16. This allows the energy in the energy superimposing winding P2 to be superimposed to the secondary winding S.

In other words, allowing the current to flow from the DC-DC converter 13 to the energy superimposing winding P2 makes it possible to supply the energy from the energy superimposing winding P2 to the plug 16 via the secondary winding S at a timing when the flyback energy in the secondary winding S is decreased, and extending the supply period of the secondary current makes it possible to extend a firing period of the plug 16. As a result, it is possible to improve combustion efficiency of fuel.

Figure 2:
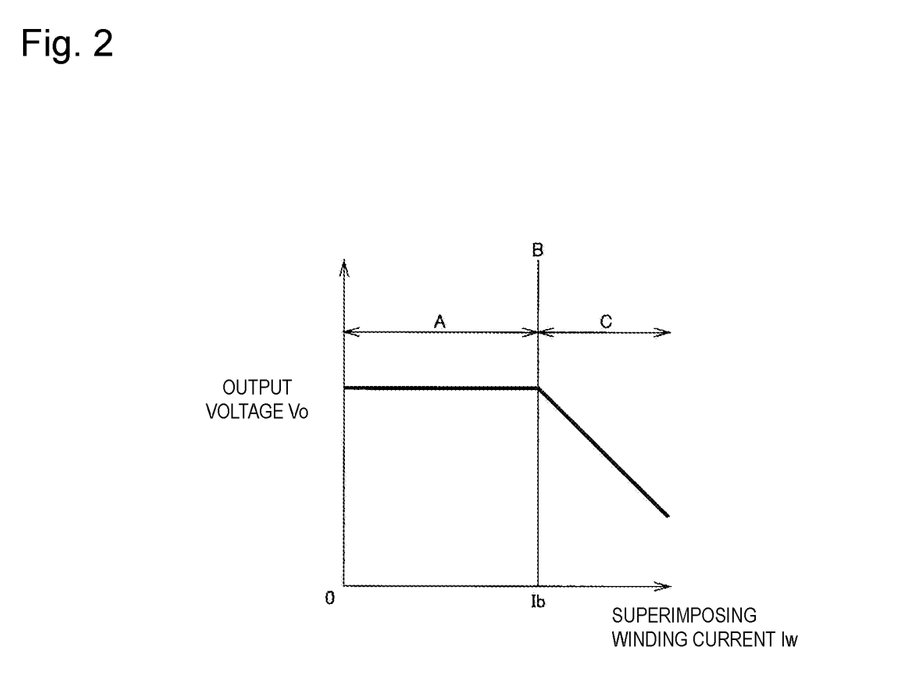
FIG. 2 is a diagram illustrating an output voltage against a superimposing winding current of the ignition device according to one or more embodiments.
Figure 3:
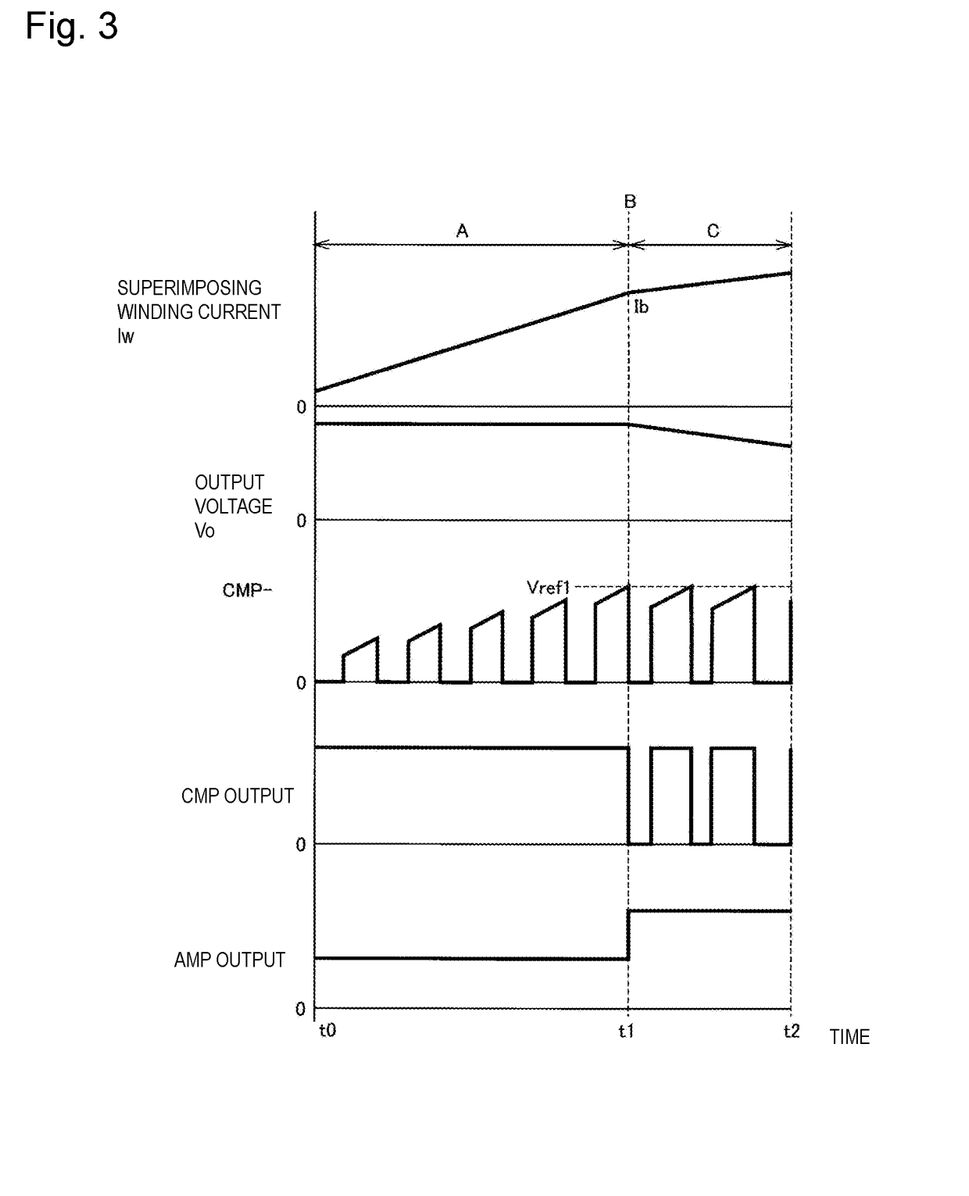
FIG. 3 is a diagram illustrating operation waveforms of parts of the ignition device according to one or more embodiments.

Next, constant voltage control by the error amplifier AMP and constant power control by the comparator CMP are described in details with reference to FIGS. 2 and 3. FIG. 2 illustrates an output voltage against a superimposing winding current. The superimposing winding current is a current flowing through the energy superimposing winding P2, and the output voltage Vo is a terminal voltage of the capacitor C2, that is, a voltage applied to the anodes of the diodes D1 to D4.

In FIG. 3, Iw represents the superimposing winding current, Vo represents the output voltage, CMP (−) represents a voltage of the inverting terminal of the comparator CMP, CMP output represents a voltage of the output terminal of the comparator CMP, and AMP output represents the output of the error amplifier AMP.

First, as illustrated in FIG. 3, during a period A (between a time t0 and a time t1), the superimposing winding current Iw is linearly increased from zero, but the voltage of the inverting terminal of the comparator CMP is lower than the reference voltage Vref1. At that time, the output of the comparator CMP is at the H level. Thus, the error amplifier AMP operates such that the output voltage Vo is restricted to a constant voltage.

The error amplifier AMP amplifies an error voltage between the voltage of the inverting terminal of the error amplifier AMP and the reference voltage Vref2 and outputs the amplified error voltage to the control circuit 132. The control circuit 132 controls on and off of the MOSFET Q3 based on the error voltage inputted from the error amplifier AMP to perform the constant voltage control of the output voltage Vo.

Next, once the superimposing winding current is increased and the superimposing winding current becomes the predetermined value Ib (a period B, a time t2), the voltage of the inverting terminal of the comparator CMP reaches the reference voltage Vref1. Thus, the output of the comparator CMP at the L level is outputted to the control circuit 132. At that time, the comparator CMP controls the control circuit 132 according to the comparator output such that the voltage of the inverting terminal and the voltage of the reference voltage Vref1 be the same.

With this, the output voltage Vo is decreased as illustrated in a period C. At that time, the output of the error amplifier AMP is fixed at the H level. The increase of the output current and the decrease of the output voltage allow constant power control to be performed.

Since the constant power control allows power supply only up to a set amount, plug ignition superimposed energy becomes constant, and also the plug current is maintained constant. In addition, since the plug 16 does not consume excessive power due to a response lag and the like, the plug 16 can be prevented from being worn out.

Moreover, since there is no need to include a shunt resistor of a current detecting resistor and a constant current detecting circuit, the number of parts can be reduced.

Embodiment 2

Figure 4:
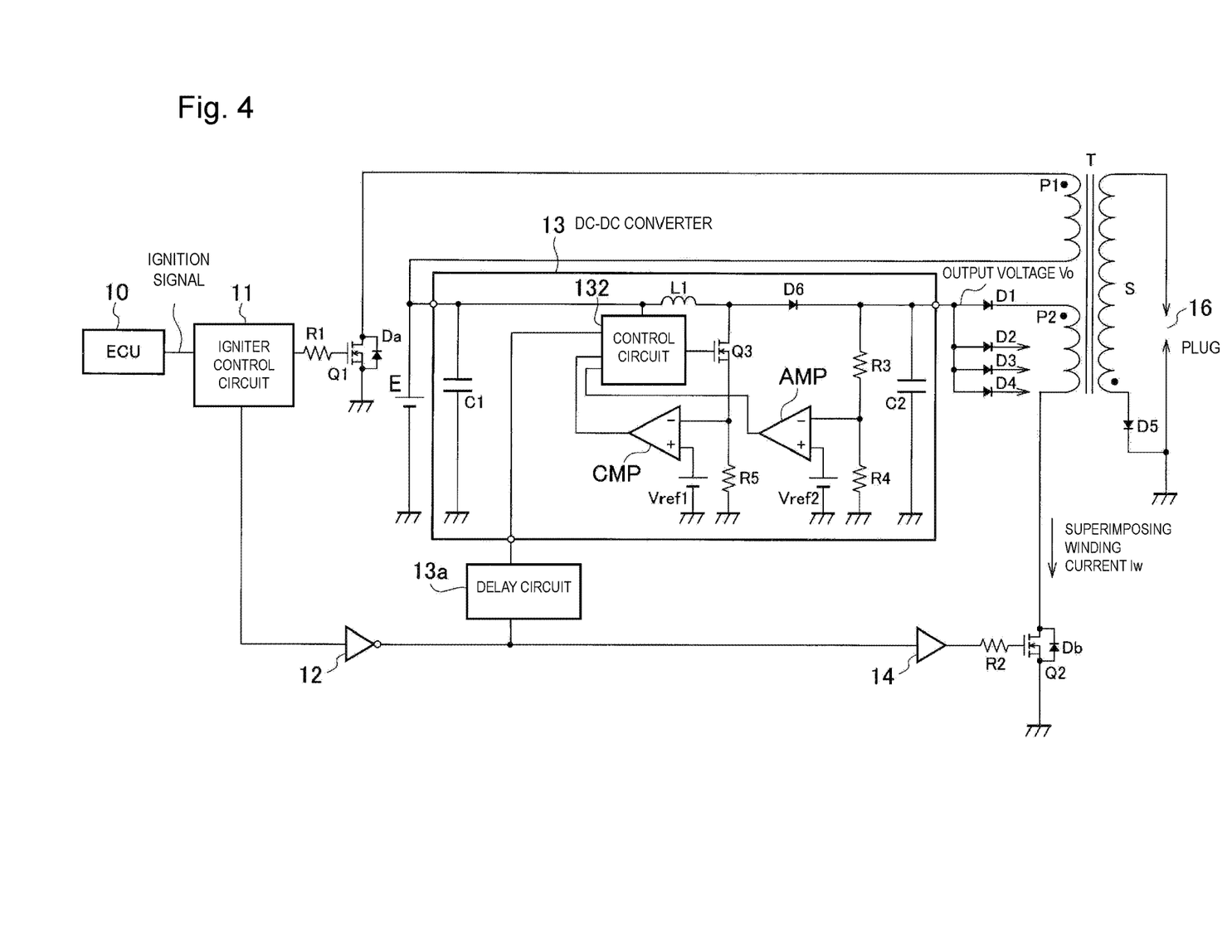
FIG. 4 is a diagram illustrating a circuit configuration of one or more ignition devices according to one or more embodiments.

FIG. 4 is a diagram illustrating a circuit configuration of one or more ignition devices according to an embodiment 2. Compared with the configuration of the ignition device according to an embodiment 1, the ignition device according to an embodiment 2 outputs the ignition signal inputted from the igniter control circuit 11 to the control circuit 132 instead of outputting the start signal inputted from the ECU 10 to the control circuit 132.

Thus, the inverter 12 and the delay circuit 13a are provided between the igniter control circuit 11 and the control circuit 132. The inverter 12 inverts the ignition signal inputted from the igniter control circuit 11 and then outputs the inverted ignition signal to the delay circuit 13a and the buffer circuit 14. The delay circuit 13a delays the ignition signal that is inverted for a predetermined period of time by the inverter 12 and then outputs the ignition signal to the control circuit 132.

Figure 5:
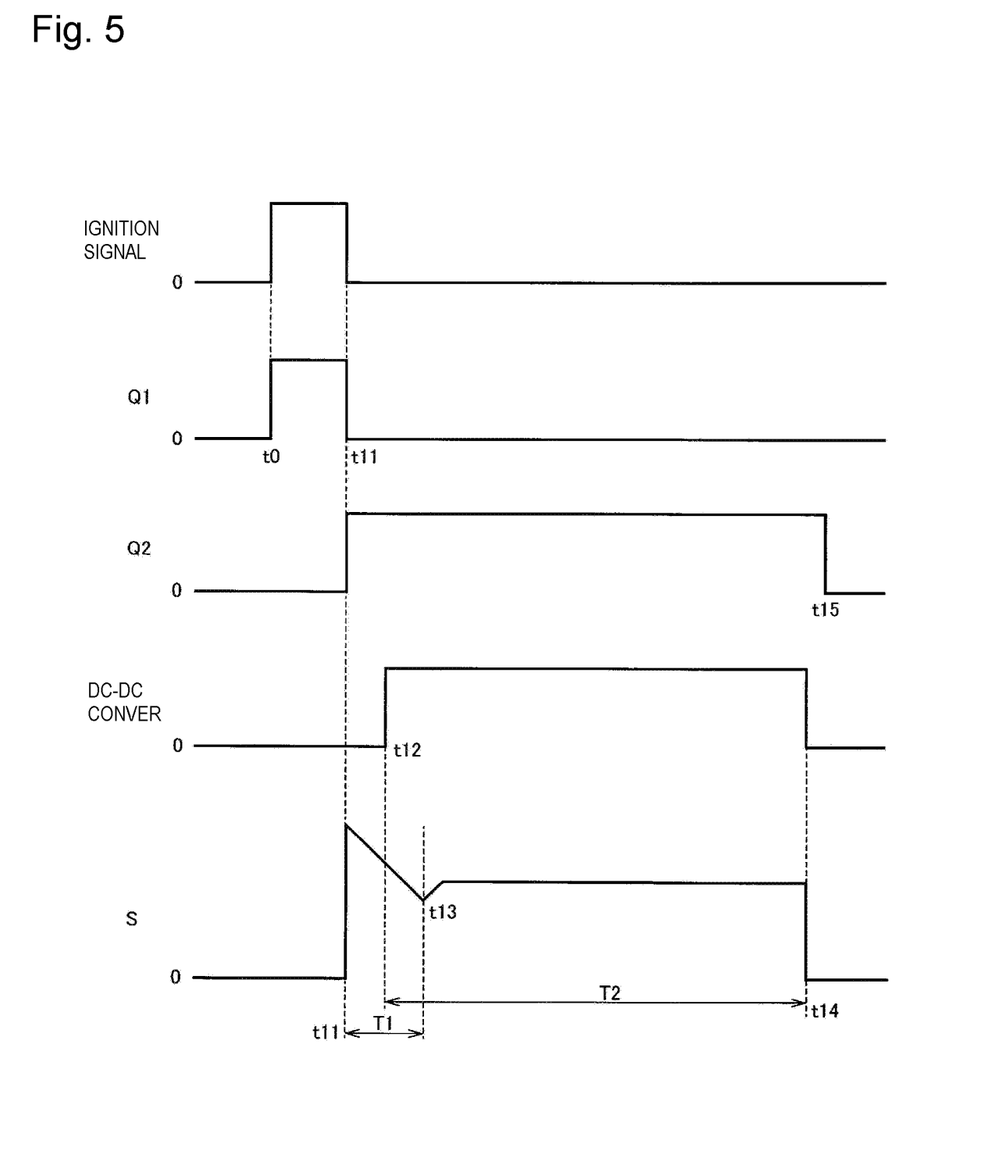
FIG. 5 is a diagram illustrating operation waveforms of the ignition device according to one or more embodiments.

An operation of the ignition device according to an embodiment 2 that is constructed as the above is described in details with reference to FIG. 5. First, once the igniter switch Q1 is turned on according to the ignition signal at a time t0, a current flows from the battery E to the ground via the igniter winding P1 and the igniter switch Q1, and the energy is stored into the igniter winding P1. Once the igniter switch Q1 is turned off, a secondary current flows from the secondary winding S via the diode D5, and the energy is supplied to the plug 16.

Next, at a time t11, the igniter switch Q1 is turned off according to the ignition signal at the L level inputted from the igniter control circuit 11. The ignition signal at the L level is inverted by the inverter 12, and the ignition signal at the H level is supplied to the gate of the MOSFET Q2 via the buffer circuit 14, whereby the MOSFET Q2 is turned on at the time t11.

The DC-DC converter 13 is started according to the ignition signal that is delayed for the predetermined period of time by the delay circuit 13a, boosts up the voltage of the battery E, and supplies the boosted voltage to the anodes of the diodes D1 to D4. As a result, a current flows from the DC-DC converter 13 to the MOSFET Q2 via the diode D1 and the energy superimposing winding P2.

At that time, the secondary current flows from the secondary winding S via the diode D5, and the energy is supplied to the plug 16. As a result, between a time t12 and a time t14, the energy from the energy superimposing winding P2 is superimposed to the secondary winding S.

In other words, allowing the current to flow from the DC-DC converter 13 to the energy superimposing winding P2 makes it possible to supply the energy from the energy superimposing winding P2 to the plug 16 at a timing when the flyback energy in the secondary winding S is decreased (between the time t12 and the time t13), and extending the supply period of the secondary current makes it possible to extend a firing period of the plug 16. As a result, it is possible to improve the combustion efficiency of the fuel.

After the DC-DC converter 13 is turned off according to the ignition signal at the time t14, the MOSFET Q2 is turned off at a time t15. This makes it possible to reduce a surge voltage of the switch Q2 at the time t15 when the MOSFET Q2 is turned off and at the time t11 when the next operation for superimposing the ignition energy is performed.

In addition, since the DC-DC converter 13 is constructed in the same manner as the DC-DC converter 13 of an embodiment 1, it is possible to perform the constant voltage control and the constant power control of the output voltage Vo.

Embodiment 3

Figure 6:
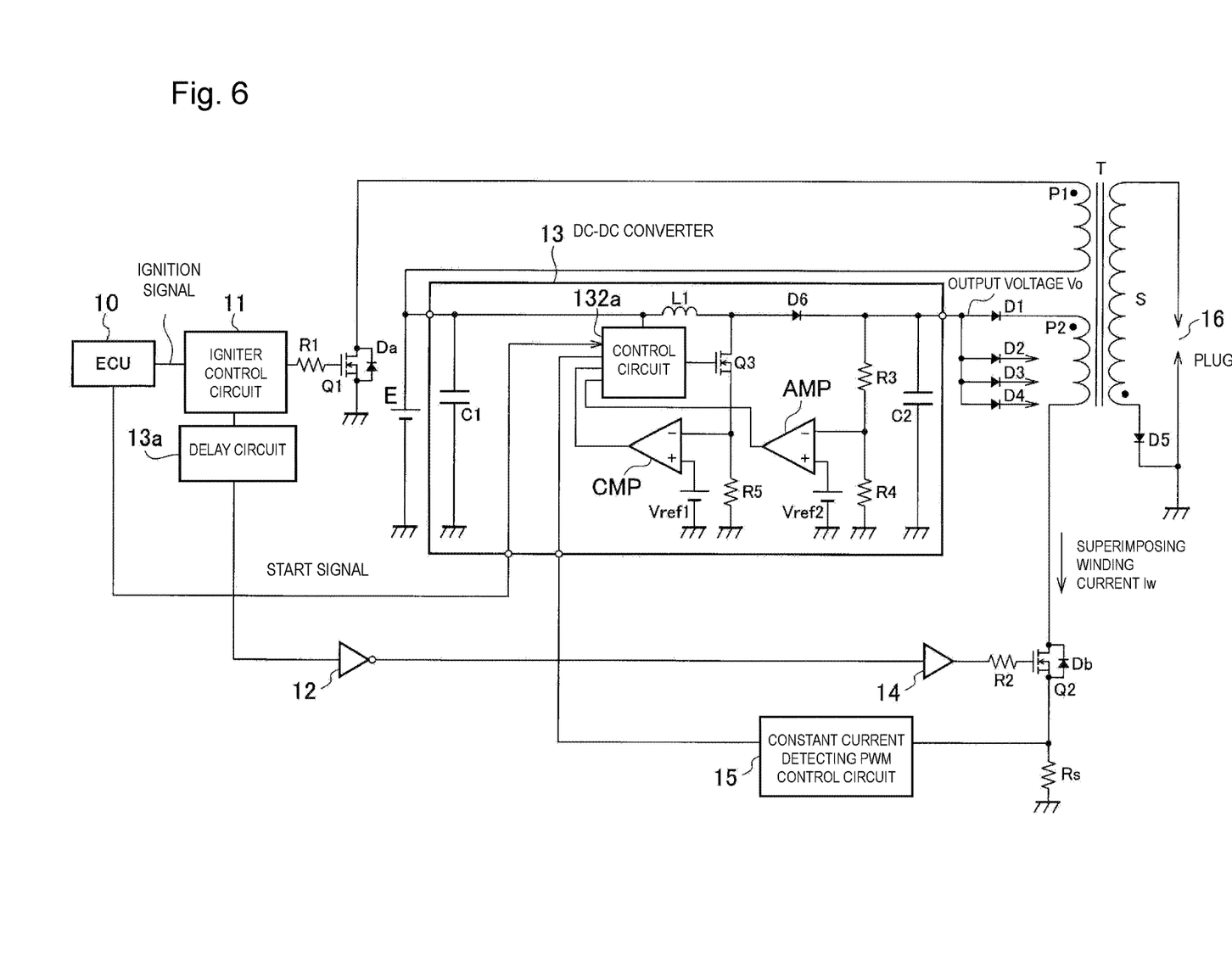
FIG. 6 is a diagram illustrating a circuit configuration of an ignition device according to one or more embodiments.

FIG. 6 is a diagram illustrating a circuit configuration of one or more ignition devices according to an embodiment 3. The ignition device according to an embodiment 3 further includes a shunt resistor Rs and a constant current detecting PWM control circuit 15 in addition to the configuration of the ignition device according to an embodiment 1.

As for the shunt resistor Rs, one end thereof is connected to the source of the MOSFET Q2 while the other end is connected to the ground. The constant current detecting PWM control circuit 15 uses the shunt resistor Rs to detect the superimposing winding current flowing to the energy superimposing winding P2 and, when the voltages on the two ends of the shunt resistor Rs based on the detected superimposing winding current reach thresholds, outputs the PWM signal to a control circuit 132a of the DC-DC converter 13.

Based on the PWM signal inputted from the constant current detecting PWM control circuit 15, the control circuit 132a of the DC-DC converter 13 controls on-duty of the PWM signal such that the voltages on the two ends of the shunt resistor Rs based on the superimposing winding current are restricted to predetermined voltages.

Figure 7:
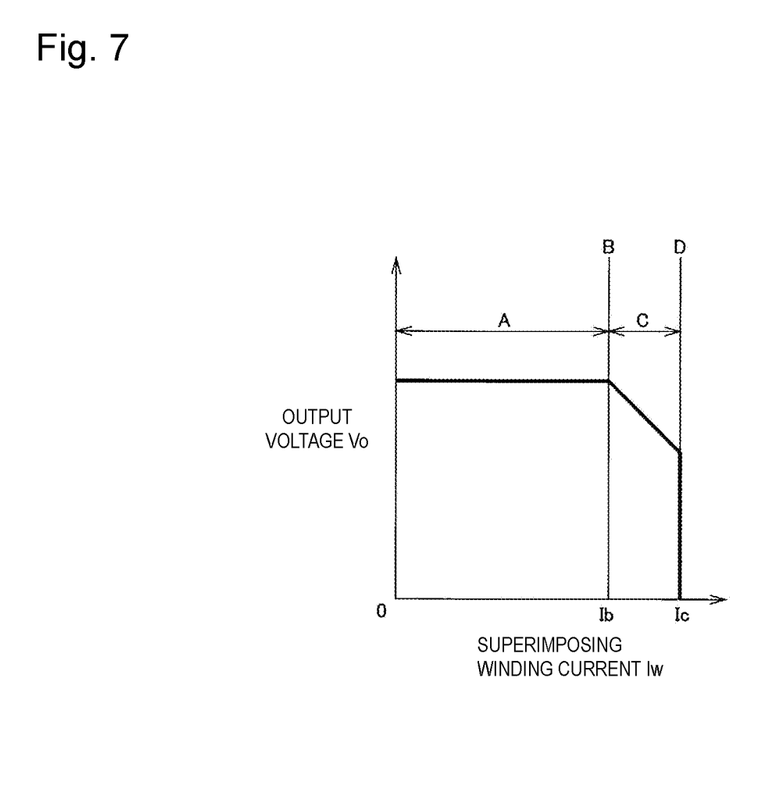
FIG. 7 is a diagram illustrating an output voltage against a superimposing winding current of the ignition device according to one or more embodiments.
Figure 8:
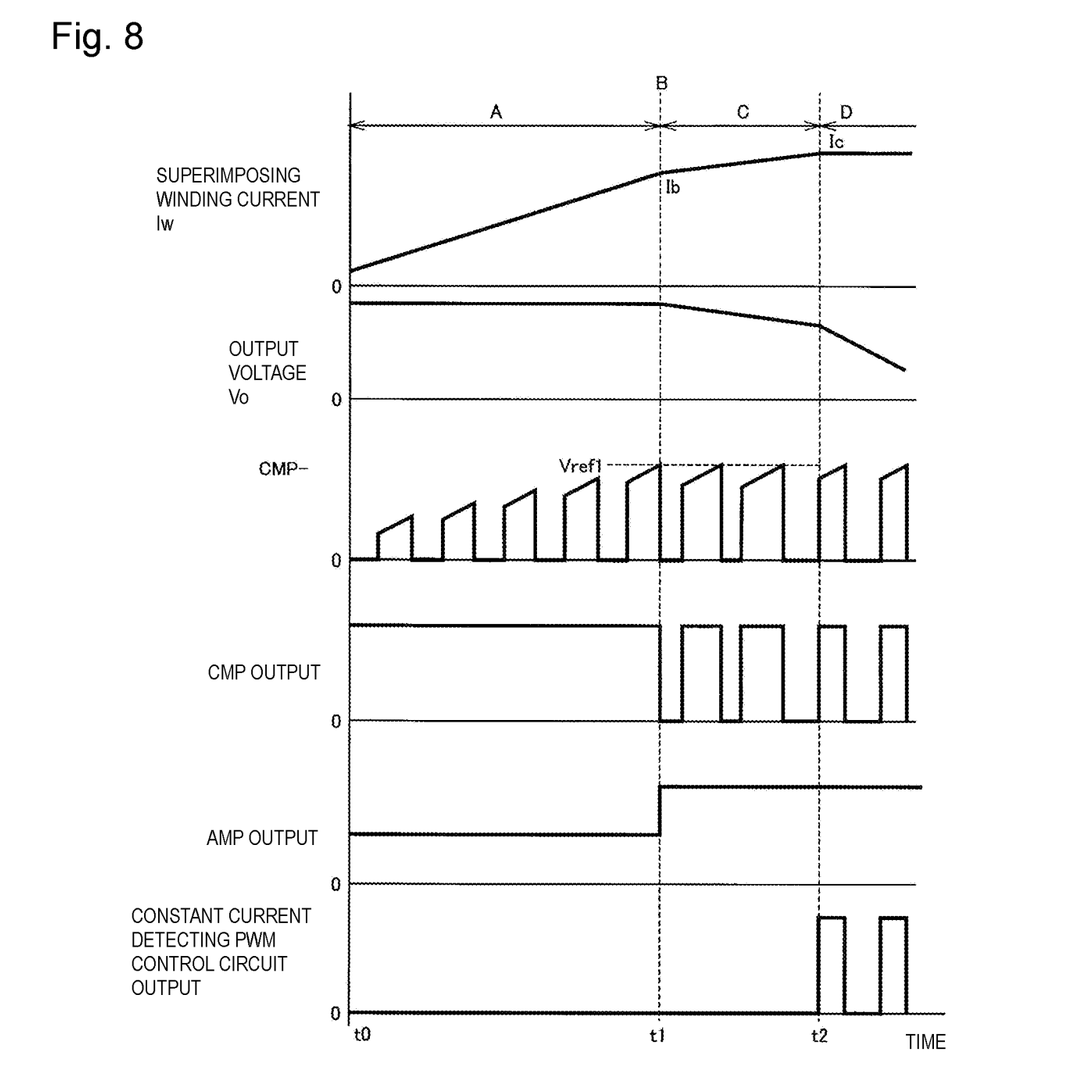
FIG. 8 is a diagram illustrating operation waveforms of parts of the ignition device according to one or more embodiments.

Next, an operation of the constant current detecting PWM control circuit 15 is described in details with reference to FIGS. 7 and 8. FIG. 7 illustrates an output voltage against a superimposing winding current. Compared with FIG. 3, FIG. 8 is different in that an output waveform of the constant current detecting PWM control circuit is added to the waveforms illustrated in FIG. 3.

First, assuming that the current Iw flowing through the energy superimposing winding P2 is increased over the predetermined value Ib and reaches a current value Ic, the current flows from the energy superimposing winding P2 to the shunt resistor Rs via the MOSFET Q2 at that time. The shunt resistor Rs detects the superimposing winding current flowing through the energy superimposing winding P2.

The constant current detecting PWM control circuit 15 determines whether the voltages on the two ends of the shunt resistor Rs based on the superimposing winding current that is detected by the shunt resistor Rs reach the thresholds. When the voltages on the two ends reach the thresholds, the constant current detecting PWM control circuit 15 outputs the PWM signal to the control circuit 132a of the DC-DC converter 13.

Based on the PWM signal from the constant current detecting PWM control circuit 15, the control circuit 132a controls on-duty of the PWM signal such that the voltages on the two sides of the shunt resistor Rs based on the superimposing winding current are restricted to the predetermined voltages. In other words, it is possible to control the current flowing through the energy superimposing winding P2 to be the constant current Ic.

In a case where the plug current is controlled by the constant power, when an excessive plug current flows depending on a combustion state, performing the constant current control makes it possible to prevent the plug current from being excessive. When a plug ignition load is reduced, an excessive plug current flows during the power control; thus, performing the constant current control makes it possible to prevent the plug current from being excessive.

In addition, since the currents in the energy superimposing winding P2 and the secondary winding S are also in a relationship corresponding to the turns ratio, the plug current can also be controlled by the superimposing winding current.

Moreover, since the plug 16 can be completely insulated by connecting the shunt resistor Rs to the energy superimposing winding P2, it is possible to cut off noise generated from the plug 16.

Embodiment 4

Figure 9:
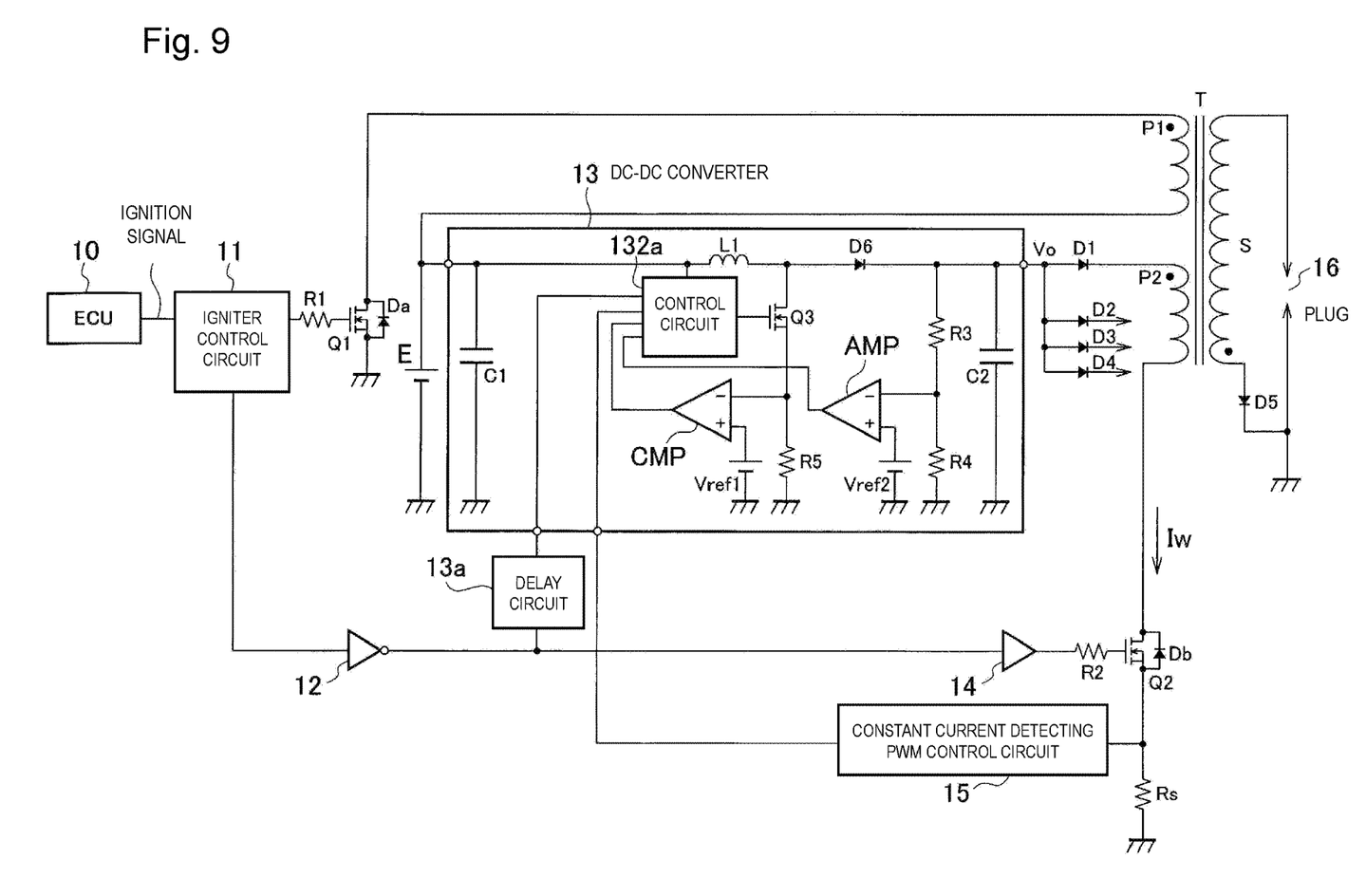
FIG. 9 is a diagram illustrating a circuit configuration of an ignition device according to one or more embodiments.

FIG. 9 is a diagram illustrating a circuit configuration of one or more ignition devices according to an embodiment 4. The ignition device according to an embodiment 4 further includes the shunt resistor Rs and the constant current detecting PWM control circuit 15 in addition to the configuration of the ignition device according to an embodiment 2.

Since the shunt resistor Rs and the constant current detecting PWM control circuit 15 may be the same as those in the ignition device according to an embodiment 3 described above, descriptions thereof are omitted herein.

According to the ignition device of an embodiment 4, since there are the shunt resistor Rs and the constant current detecting PWM control circuit 15 provided, it is possible to obtain a similar effect as the effect of the ignition device of an embodiment 3.

The windings of the transformer include the first and second windings in the conventional ignition device illustrated in FIG. 10; however, the windings in the embodiments include not only the first and second windings but also the energy superimposing winding, which carries a current during the period when the igniter switch is turned off.

In addition, in the conventional ignition device illustrated in FIG. 10, power is supplied from only the battery; however, in the embodiments, power is supplied from the auxiliary DC-DC converter to the energy superimposing winding.

Moreover, since the DC-DC converter performs the constant power control, the power is limited to a required amount, and the energy from the energy superimposing winding is superimposed to the secondary side of the transformer.

Furthermore, when the plug ignition load is reduced, the excessive plug current flows during the power control. In this case, the shunt resistor is connected to the energy superimposing winding without connecting the shunt resistor to the plug line on the secondary side, detects the plug current, and feedbacks the detected plug current to the DC-DC converter, thereby performing the constant current control.

As described above, according to the ignition device of one or more embodiments, the drive device turns the first switch from on-state to off-state to allow a secondary current to flow through the second winding, and turns the second switch from off-state to on-state to supply an output of the booster to the third winding and superimpose a second current to the second winding. As a result, it is possible to extend the firing period of the plug and thus to improve the combustion efficiency of the fuel.

In addition, when a third winding current, which flows through the third winding of the ignition coil, becomes equal to or greater than a predetermined value, the booster performs control such that power generated by the third winding current and an output voltage of the booster is restricted to constant power. Thus, the plug ignition superimposed energy becomes constant, and also the plug current becomes constant. As a result, the plug does not consume excessive power, and thus can be prevented from being worn out.

The above-described aspects may be combined with each other as practicable within the contemplated scope of embodiments. The above described embodiments are to be considered in all respects as illustrative, and not restrictive. The illustrated and described embodiments may be extended to encompass other embodiments in addition to those specifically described above without departing from the intended scope of the invention. The scope of the invention is to be determined by the appended claims when read in light of the specification including equivalents, rather than solely by the foregoing description. Thus, all configurations including configurations that fall within equivalent arrangements of the claims are intended to be embraced in the invention.

The invention claimed is:

1. An ignition device comprising:
an ignition coil including a first winding, a second winding, and a third winding that are electromagnetically coupled to each other;
a first switch electrically connected to a first end of the first winding;
a battery electrically connected to a second end of the first winding;
a booster including a first end electrically connected to the battery and a second end electrically connected to a first end of the third winding;
a second switch electrically connected to a second end of the third winding; and
a drive device that drives the first switch and the second switch to turn on and off, wherein
the drive device turns the first switch from on-state to off-state to allow a secondary current to flow through the second winding, and turns the second switch from off-state to on-state to supply an output of the booster to the third winding and superimpose a second current to the second winding, and
when a third winding current, which flows through the third winding of the ignition coil, becomes equal to or greater than a predetermined value, the booster controls such that power generated by the third winding current and an output voltage of the booster is restricted to a constant power.

2. The ignition device according to claim 1, further comprising a constant current control circuit that detects the third winding current, which flows through the third winding of the ignition coil, and outputs a pulse-width modulated (PWM) signal to the booster when a voltage based on the detected third winding current reaches a threshold, wherein
based on the PWM signal inputted from the constant current control circuit, the booster controls such that the voltage based on the third winding current is restricted to a predetermined voltage.

3. The ignition device according to claim 2, further comprising a shunt resistor connected to the second switch in series, wherein
the constant current control circuit detects a current flowing to the shunt resistor as the third winding current.

* * * * *